United States Patent
Shur et al.

(10) Patent No.: US 9,594,615 B2
(45) Date of Patent: Mar. 14, 2017

(54) ESTIMATING FLASH QUALITY USING SELECTIVE ERROR EMPHASIS

(71) Applicant: APPLE INC., Cupertino, CA (US)

(72) Inventors: Yael Shur, Herzlia Pituach (IL); Eyal Gurgi, Herzlia Pituach (IL); Moshe Neerman, Herzlia Pituach (IL); Naftali Sommer, Herzlia Pituach (IL)

(73) Assignee: APPLE INC., Cupertino, CA (US)

( * ) Notice: Subject to any disclaimer, the term of this patent is extended or adjusted under 35 U.S.C. 154(b) by 109 days.

(21) Appl. No.: 14/501,081

(22) Filed: Sep. 30, 2014

(65) Prior Publication Data

US 2016/0092284 A1     Mar. 31, 2016

(51) Int. Cl.
| | |
|---|---|
| G06F 11/07 | (2006.01) |
| G06F 11/10 | (2006.01) |
| G11C 11/56 | (2006.01) |
| G11C 16/26 | (2006.01) |
| G11C 29/00 | (2006.01) |
| G11C 29/42 | (2006.01) |

(52) U.S. Cl.
CPC .......... *G06F 11/076* (2013.01); *G06F 11/073* (2013.01); *G11C 11/5642* (2013.01); *G11C 11/5692* (2013.01); *G06F 11/1012* (2013.01); *G06F 11/1072* (2013.01); *G11C 16/26* (2013.01); *G11C 29/00* (2013.01); *G11C 29/42* (2013.01)

(58) Field of Classification Search
CPC ............. G06F 11/1072; G06F 11/1012; G06F 11/076; G06F 11/073; G11C 11/5692; G11C 11/5642; G11C 29/52; G11C 29/00; G11C 16/26

USPC ......................................................... 714/763
See application file for complete search history.

(56) References Cited

U.S. PATENT DOCUMENTS

| | | | |
|---|---|---|---|
| 5,657,332 A | 8/1997 | Auclair et al. | |
| 6,751,766 B2* | 6/2004 | Guterman | G06F 11/1012 714/736 |
| 7,904,788 B2* | 3/2011 | Brandman | G06F 11/1072 714/760 |
| 8,095,836 B2 | 1/2012 | Eguchi et al. | |
| 8,296,637 B1* | 10/2012 | Varnica | H03M 13/1102 714/794 |
| 8,433,980 B2 | 4/2013 | Alrod et al. | |
| 8,627,188 B2 | 1/2014 | Weingarten et al. | |
| 8,923,066 B1* | 12/2014 | Subramanian | G11C 16/26 365/185.09 |
| 8,984,375 B2* | 3/2015 | Hashimoto | G06F 11/004 714/47.2 |
| 9,235,467 B2* | 1/2016 | Micheloni | G06F 11/1012 |
| 2011/0099460 A1* | 4/2011 | Dusija | G11C 11/5621 714/773 |
| 2013/0173985 A1* | 7/2013 | Chung | H03M 13/1111 714/755 |

(Continued)

*Primary Examiner* — James C Kerveros
(74) *Attorney, Agent, or Firm* — D. Kligler IP Services Ltd.

(57) ABSTRACT

A method for data storage includes reading from a memory device data that is stored in a group of memory cells as respective analog values, and classifying readout errors in the read data into at least first and second different types, depending on zones in which the analog values fall. A memory quality that emphasizes the readout errors of the second type is assigned to the group of the memory cells, based on evaluated numbers of the readout errors of the first and second types.

20 Claims, 3 Drawing Sheets

(56) References Cited

U.S. PATENT DOCUMENTS

| | | |
|---|---|---|
| 2013/0290811 A1 | 10/2013 | Liikanen et al. |
| 2014/0082459 A1* | 3/2014 | Li .................... G06F 11/1666 |
| | | 714/773 |
| 2014/0095962 A1 | 4/2014 | Moon et al. |
| 2014/0143632 A1 | 5/2014 | North et al. |
| 2015/0012795 A1* | 1/2015 | Sakaue ............ G06F 11/1012 |
| | | 714/758 |

* cited by examiner

ESTIMATING FLASH QUALITY USING SELECTIVE ERROR EMPHASIS

TECHNICAL FIELD

Embodiments described herein relate generally to memory devices, and particularly to methods and systems for estimating the quality of memory cells and stored data using selective error emphasis.

BACKGROUND

Several types of memory devices, such as Flash memories, use arrays of memory cells for storing data. Each memory cell stores a quantity of an analog value, also referred to as a storage value, such as an electrical charge or voltage. This analog value represents the information stored in the cell. In Flash memories, for example, each analog memory cell holds a certain amount of electrical charge.

The analog values stored may deviate from their nominal values due to various reasons, thus degrading the memory quality. Methods for estimating the memory quality are known in the art. For example, U.S. Patent Application Publication 2013/0290811, whose disclosure is incorporated herein by reference, describes an encoder that reads a set of data from memory cells to obtain retrieved data influenced by one or more distortion mechanisms as a result of having been stored. A quality metric is generated responsive to the retrieved data that changes in value responsive to differences between the user data and the associated retrieved data. A quality monitor establishes a relationship between a current value of the quality metric and a threshold value and monitors the relationship as being indicative of a degradation of the quality of the retrieved data, and selectively initiates an error response. In another embodiment, a correction value is iterated through a set of values as a quality metric is monitored such that the value of the quality metric which most closely approaches the value of the quality metric immediately subsequent to an initial writing of the data can be selected.

Reading errors can be classified into hard and soft errors in various ways. For example, U.S. Pat. No. 5,657,332, whose disclosure is incorporated herein by reference, describes a solid-state memory such as EEPROM or Flash EEPROM in which soft errors occur during normal use of the solid-state memory. A soft error results from the programmed threshold voltage of a memory cell being drifted from its originally intended level. The error is initially not readily detected during normal read until the cumulative drift becomes so severe that it develops into a hard error. Data could be lost if enough of these hard errors swamps available error correction codes in the memory. A memory device and techniques therefor are capable of detecting these drifts and substantially maintaining the threshold voltage of each memory cell to its intended level throughout the use of the memory device, thereby resisting the development of soft errors into hard errors.

U.S. Pat. No. 8,095,836, whose disclosure is incorporated herein by reference, described a technique for detecting an imminent read failure in a memory array. The technique includes determining a first incident count for a memory array that does not exhibit an uncorrectable error correcting code (ECC) read during an array integrity check. In this case, the first incident count corresponds to an initial number of ECC corrections that are performed when the array integrity check of the memory array initially fails. The technique also includes determining a current count for the memory array when the memory array does not exhibit an uncorrectable ECC read during subsequent array integrity checks. In this case, the current count corresponds to a subsequent number of error correcting code (ECC) corrections required during the subsequent array integrity checks. An indication of an imminent read failure for the memory array is provided when the current count exceeds the first incident count by a predetermined amount.

SUMMARY

An embodiment that is described herein provides a method for data storage, including reading from a memory device data that is stored in a group of memory cells as respective analog values, and classifying readout errors in the read data into at least first and second different types, depending on zones in which the analog values fall. A memory quality that emphasizes the readout errors of the second type is assigned to the group of the memory cells, based on evaluated numbers of the readout errors of the first and second types.

In some embodiments, reading the data includes setting one or more read thresholds, classifying the readout errors that fall in a predefined vicinity of the read thresholds to the first type, and classifying the readout errors that fall outside the predefined vicinity of the read thresholds to the second type. In other embodiments, assigning the memory quality includes estimating a quality metric and comparing the quality metric to a quality threshold. In yet other embodiments, emphasizing the readout errors of the second type includes giving the readout errors of the second type a higher emphasis in setting the quality threshold relative to the readout errors of the first type.

In an embodiment, emphasizing the readout errors of the second type includes giving the readout errors of the second type a higher emphasis in setting the quality metric relative to the readout errors of the first type. In another embodiment, emphasizing the readout errors of the second type includes determining the quality threshold as a non-increasing function of the evaluated number of readout errors of the second type. In yet another embodiment, the non-increasing function includes a piecewise linear function.

In some embodiments, emphasizing the readout errors of the second type includes estimating the quality metric as a non-decreasing function of both the evaluated numbers of the readout errors of the first and second types. In other embodiments, the non-decreasing function includes a piecewise linear function. In yet other embodiments, assigning the memory quality includes giving to the readout errors of the second type different emphasis levels at respective different times during a lifetime of the memory device.

In an embodiment, the data is stored redundantly in multiple memory devices using a Redundant Array of Independent Disks (RAID) storage scheme, and reading the data includes recovering in one memory device error-free data from erroneous data using redundant data stored in one or more other memory devices, and identifying the readout errors by comparing the recovered data and the erroneous data. In another embodiment, reading from the memory device and assigning the memory quality are performed during production of the memory device.

There is additionally provided, in accordance with an embodiment that is described herein, apparatus including a memory device that includes memory cells and storage circuitry. The storage circuitry is configured to read from the memory device data that is stored in a group of the memory cells as respective analog values, to classify readout errors in the read data into at least first and second different types, depending on zones in which the analog values fall, and to assign to the group of the memory cells, based on evaluated numbers of the readout errors of the first and second types, a memory quality that emphasizes the readout errors of the second type.

These and other embodiment will be more fully understood from the following detailed description of the embodiments thereof, taken together with the drawings in which:

DETAILED DESCRIPTION OF EMBODIMENTS

Overview

Figure 1:
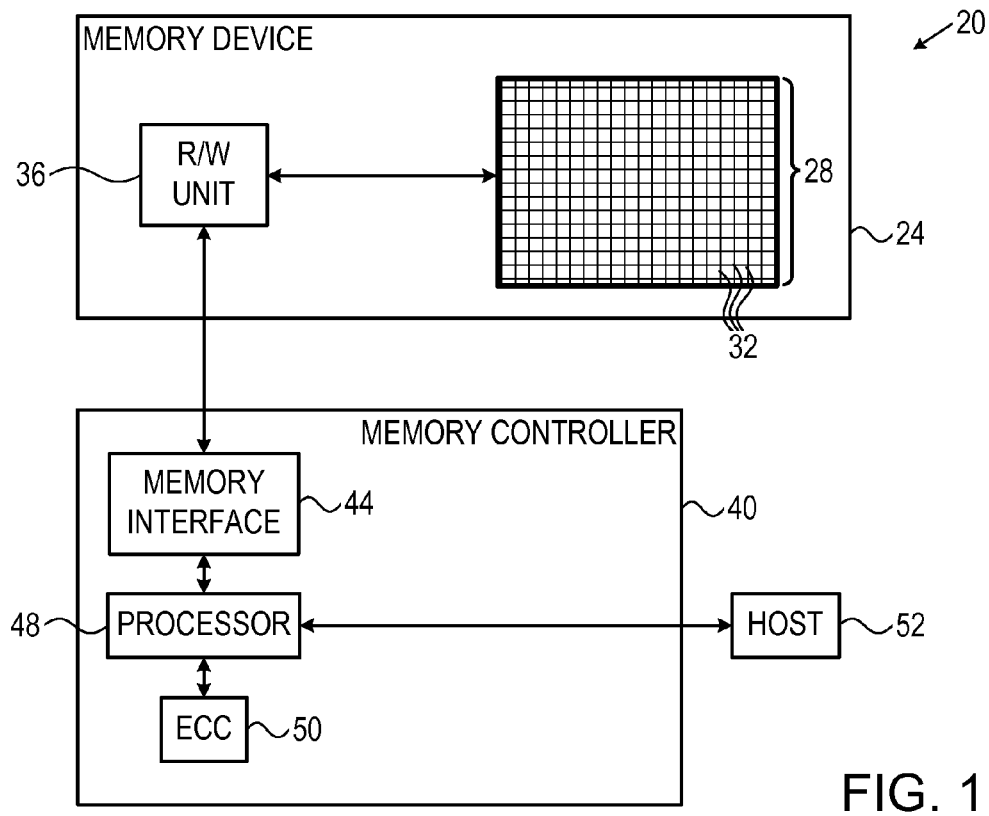
FIG. 1 is a block diagram that schematically illustrates a memory system, in accordance with an embodiment that is described herein.

Memory quality generally depends on various parameters, and may change over the lifetime of the memory device. Embodiments that are disclosed herein provide improved methods and systems for estimating the memory quality. The memory quality may refer to the quality of the physical medium of the device, e.g., wearing of the memory cells, or to the storage quality, i.e., the reliability of the stored data.

The quality of the physical medium may be affected, for example, by usage patterns. For example, the performance of some types of analog memory cells deteriorates as a function of use, e.g., as a function of the number (or rate) of Programming and Erasure (P/E) cycles applied to the cells. This property is sometimes referred to as cell wearing. The reliability of analog memory cells also degrades, for example, when retained for prolonged time periods in an erased state, or when subjected to extreme temperatures or voltages.

The storage quality of the memory device may degrade for various reasons, even at the beginning of its lifetime. Example factors include programming errors due to imperfect programming process or writing to neighboring memory cells, and suboptimal positioning of the read thresholds, e.g., due to drift of the threshold voltage distributions, for example, because of aging or change in temperature or supply voltage.

In the disclosed techniques the memory quality is estimated regardless of the specific cause of quality degradation (if any). The disclosed techniques are thus suitable for estimating quality of either the quality of the stored data or of the underlying physical medium of the memory cells, or a combination of both quality types.

Degradation of the memory quality may result in readout errors. In some embodiments, a storage system comprises a memory device and a memory controller that manages the storage. In an embodiment, the memory controller comprises an Error Correcting Code (ECC) unit, which encodes the data to be written in the memory device, and decodes the data read from the memory device in an attempt to correct readout errors.

In some embodiments, the memory quality may degrade to unacceptable levels, for example to the point at which the number of readout errors exceeds the capability of the ECC to correct these errors. In an embodiment, the memory controller estimates the memory quality, and, when detecting that the memory quality has degraded to a certain level, takes suitable action to improve the memory quality, generates a suitable alert, or both.

In principle, the memory controller can estimate the memory quality proportionally to the total number of readout errors. Such an approach, however, weights all the readout errors equally, which may result with a biased estimation, because some error types are more harmful than others. When the memory quality estimation is biased, the estimated quality may, for example, indicate a quality level that is significantly higher than the actual quality level of the memory, and as a result the memory controller may fail to take action before degradation becomes unrecoverable.

In some embodiments, when reading analog values (e.g., threshold voltages) from a group of memory cells, the memory controller sets one or more read thresholds and assigns each analog value a respective reliability measure, such as a Log Likelihood Ratio (LLR), depending on the distance of the analog value from the relevant read threshold (s). The reliability measures typically comprise a sign that denotes a hard bit decision, and a nonnegative magnitude that indicates the reliability level assigned to the hard bit.

Typically, such a reading scheme assigns high reliability levels to hard bit decisions of threshold voltages that are close to the respective nominal programming levels (i.e., far away from the read thresholds) and are therefore likely to be correct. Similarly, the hard bit decisions for memory cells whose threshold voltage falls in a middle region between adjacent programming levels, i.e., close to the read thresholds, are more likely to be erroneous and are therefore assigned with low reliability levels.

In some situations, however, some analog values fall far away from the read thresholds (and are therefore conventionally assigned high reliability) but their hard bit decisions are nevertheless erroneous. Such errors are referred to herein as hard errors. Errors for which the analog value falls close to the read thresholds (and are therefore conventionally assigned low reliability) are referred to herein as soft errors. As can be appreciated, hard errors are considerably more harmful to the ECC decoding performance than soft errors.

Hard errors may be caused by various factors. For example, programming neighboring memory cells may shift the threshold voltage of a given memory cell to a level near another (not necessarily adjacent) nominal programming level, and when read, interpreted (falsely) as the other programming level and assigned a high reliability level. As another example, a memory cell at the long tail of the threshold voltage distribution, whose threshold voltage falls far within the distribution of an adjacent programming level, may be erroneously interpreted as belonging to the other programming level and assigned a high reliability measure. Such a long tail can be created, for example, by repeated reading of the memory cells, e.g., cells that are programmed to the erased programming level.

As yet another example, hard errors may be created when programming a high significance bit page. For example, in some embodiments writing a high significance bit page involves reading a lower significance bit page first, typically without applying any error correcting coding. Therefore, reading errors in the lower significance bit page may result in hard errors when programming the high significance bit page.

Typically, when reading a group of memory cells, the number of hard errors is smaller than the number of soft errors. For example, the ratio between the numbers of soft and hard errors may be on the order of ten or more, e.g., 300 to 20. Since, however, the ECC decoder is typically designed to correct the soft errors, the hard errors tend to degrade the decoding performance much more severely than the soft errors. Unbiased quality estimation should therefore emphasize the hard errors relative to the soft errors.

In the disclosed techniques, the memory controller classifies the readout errors into multiple different types in accordance with respective voltage zones in which the corresponding threshold voltages fall, and assesses the memory quality by selectively emphasizing errors of different types. The embodiments described herein refer mainly to two error types, i.e., hard and soft errors, and to quality estimation that emphasizes the hard errors relative the soft errors. In alternative embodiments, any other suitable set of error types can be used, possibly with a number of error types larger than two, in which case each error type is assigned a respective suitable weight (e.g., using a smoothing weighting function) in the quality estimation.

The memory controller can classify the readout errors into the error types in various ways. In some embodiments, the memory controller classifies the readout errors in accordance with respective voltage zones, which can be fixed or updated adaptively. In one embodiment, the memory controller defines soft error zones as voltage ranges in the vicinity of the read thresholds. The memory controller additionally defines the hard error zones as voltage ranges outside the soft zones. Alternatively, any other suitable classification method can also be used. Following the classification, the memory controller evaluates the number of soft and hard errors.

The memory controller can assess the memory quality with emphasis to the hard errors in various ways. In some embodiments, based on the evaluated numbers of soft and hard errors, the memory controller estimates a quality metric and determines a quality threshold, wherein at least one of the quality metric and quality threshold emphasizes the hard errors relative to the soft errors. The memory controller then compares between the quality metric and the quality threshold to decide whether the quality is sufficient.

In some embodiments, emphasizing the hard errors is done by determining the quality threshold as a non-increasing function of the number of the hard errors, and estimating the quality metric as the sum of the numbers of the hard and soft errors. The non-increasing function may comprise, for example, a nonlinear function, or a piecewise linear function. In an embodiment, the quality threshold is constant up to a given number of the hard errors, and decreases linearly for larger numbers of the hard errors.

In other embodiments, emphasizing the hard errors is done by estimating the quality metric as a non-decreasing function of the numbers of the hard and soft errors, and determining a constant quality threshold. The non-decreasing function may comprises, for example, a nonlinear function or a piecewise linear function. In an embodiment, the piecewise linear function comprises two segments, wherein the second segment starts at a given value of the number of the hard errors.

In the disclosed techniques, readout errors of different types, such as hard and soft errors, are given different emphasis levels in the overall quality measure assigned to a group of memory cells. By giving the hard errors a higher emphasis compared to the soft errors, estimation of the memory quality becomes essentially unbiased, and the memory controller may apply procedures to improve the memory quality before the memory degradation becomes unrecoverable.

System Description

FIG. 1 is a block diagram that schematically illustrates a memory system 20, in accordance with an embodiment that is described herein. System 20 can be used in various host systems and devices, such as in computing devices, cellular phones or other communication terminals, removable memory modules (e.g., "disk-on-key" or "Flash drive" devices), Solid State Disks (SSD), digital cameras, music and other media players and/or any other system or device in which data is stored and retrieved.

System 20 comprises a memory device 24, which stores data in a memory cell array 28. The memory array comprises multiple memory cells 32, such as analog memory cells. In the context of the present patent application and in the claims, the term "analog memory cell" is used to describe any memory cell that holds a continuous, analog value of a physical parameter, such as an electrical voltage or charge. Array 28 may comprise solid-state analog memory cells 32 of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to analog memory, the disclosed techniques may also be used with various other memory types.

The charge levels stored in the cells and/or the analog voltages or currents written into and read out of the cells are referred to herein collectively as analog values, storage values or analog storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell. The techniques described herein additionally apply to storage densities of a non-integer number of bits per memory cell, i.e., a number of programming levels that is not an integer power of two.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having an integer resolution of one or more bits. Data is typically written to and read from the memory cells in groups that are referred to as pages. In some embodiments, the R/W unit can erase a group of cells 32 by applying one or more negative erasure pulses to the cells.

The storage and retrieval of data in and out of memory device 24 is performed by a memory controller 40. Memory controller 40 comprises an interface 44 for communicating with memory device 24, a processor 48, and an Error Correcting Code (ECC) unit 50. The disclosed techniques can be carried out by memory controller 40, by R/W unit 36, or both. Thus, in the present context, memory controller 40 and R/W unit 36 are referred to collectively as storage circuitry that carries out the disclosed techniques.

Memory controller 40 communicates with a host 52, for accepting data for storage in the memory device and for outputting data retrieved from the memory device. ECC unit 50 encodes the data for storage using a suitable ECC and decodes the ECC of data retrieved from the memory. Any suitable type of ECC, such as, for example, Low Density Parity Check (LDPC), Reed-Solomon (RS) or Bose-Chaudhuri-Hocquenghem (BCH), can be used. The output of ECC unit 50 in the encode direction is also referred to as a "code word."

Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example system configuration, which is shown purely for the sake of conceptual clarity. Any other suitable memory system configuration can also be used. For example, although the example of FIG. 1 shows a single memory device, in alternative embodiments memory controller 40 may control multiple memory devices 24, e.g., in a RAID storage system. Elements that are not necessary for understanding the principles of the present disclosure, such as various interfaces, addressing circuits, timing and sequencing circuits and debugging circuits, have been omitted from the figure for clarity.

In the example system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 44 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device. The memory array is typically divided into multiple memory pages, i.e., groups of memory cells that are programmed and read simultaneously.

In some embodiments, memory pages are sub-divided into sectors. Pages may be mapped to word lines in various manners. Each word line may store one or more pages. A given page may be stored in all the memory cells of a word line, or in a subset of the memory cells (e.g., the odd-order or even-order memory cells).

Erasing of cells is usually carried out in blocks that contain multiple pages. Typical memory devices may comprise thousands of erasure blocks. In a typical two-bit-per-cell MLC device, each erasure block is on the order of 32 word lines, each comprising several tens of thousands of cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used. Some memory devices comprise two or more separate memory cell arrays, often referred to as planes. Since each plane has a certain "busy" period between successive write operations, data can be written alternately to the different planes in order to increase programming speed.

Figure 2:
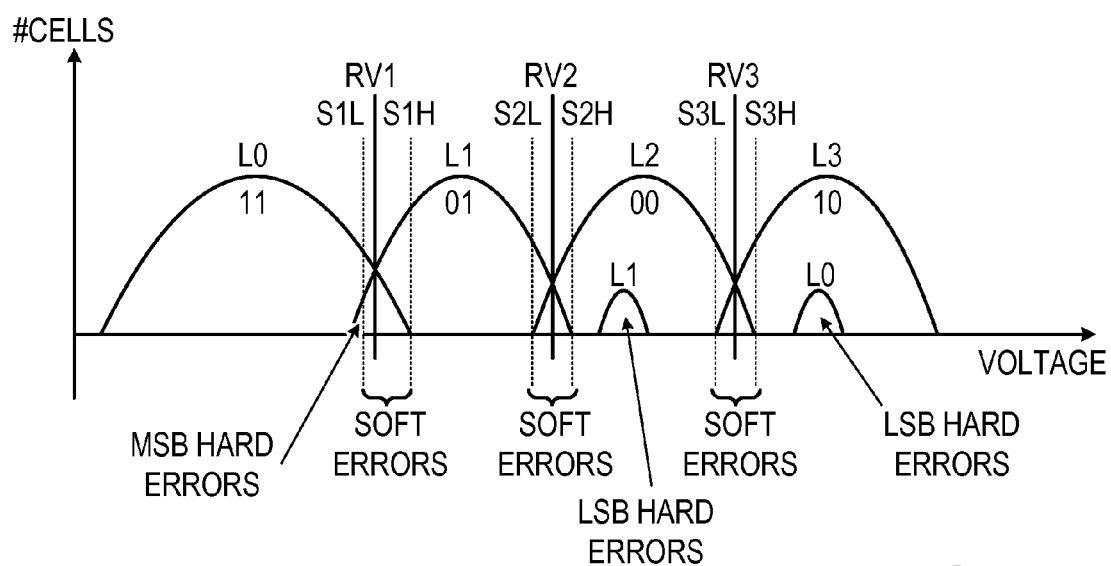
FIG. 2 is a diagram depicting threshold voltage distributions in a group of memory cells of a 2 bits/cell device, including zones of soft and hard readout errors, in accordance with an embodiment that is described herein.

FIG. 2 is a diagram depicting threshold voltage distributions in a group of memory cells of a 2 bits/cell device, including zones of soft and hard readout errors, in accordance with an embodiment that is described herein. In FIG. 2, L0 . . . L3 denote the four nominal programming levels in a 2 bit/cell MLC device and their respective distributions. In some programming schemes, the memory controller programs a Least Significant Bit (LSB) page and a Most Significant Bit (MSB) page separately. The programming levels L0, L1, L2 and L3 represent respective 2 bit stored values '11', '01', '00' and '10', wherein the right bit denotes a LSB and the left bit denotes a MSB.

Note that in the present example, each of the distributions L0 and L1 includes a small secondary peak in addition to the main distribution peak. The secondary peaks of L0 and L1 are positioned below distributions L3 and L2, respectively. The secondary peaks are related, for example, to memory cells that suffer programming errors created during the application of a programming procedure as described above.

In the example configuration of FIG. 1, processor 48 of memory controller 40 decodes the data stored in a group of memory cells 32 using ECC 50. Typically, processor 48 instructs R/W unit 36 to read the group of memory cells one or more times, using one or more respective read thresholds (not all of these read thresholds are shown in the figure), so as to produce readout results. In such a readout scheme, the memory controller is provided with one or more hard readout results for each memory cell in the group. The memory controller then derives soft reliability measures for the various data bits, and decodes the data using the soft reliability measures.

The description that follows refers mainly to Log Likelihood Ratios (LLRs) that are derived for the respective data bits. The disclosed techniques, however, are not limited to LLRs and can be used with any other suitable type of soft reliability measures. Typically, the reliability measures are signed, i.e., comprise both magnitude and sign information.

To read the LSB page, the memory controller typically sets a read threshold RV2, which separates between cells that are programmed to L0 or L1 (LSB=1) and cells that are programmed to L2 or L3 (LSB=0). To read a MSB page, the memory controller typically sets read thresholds RV1 and RV3 to separate between memory cells that are programmed to L0 or L3 (MSB=1) and memory cells that are programmed to L1 or L2 (MSB=0). RV1 . . . RV3 can serve, for example, as a central read threshold among the multiple thresholds used for evaluating the reliability measures.

In FIG. 2, pairs of soft thresholds (SiL, SiH) define soft error zones around the respective read threshold RVi, wherein i=1 . . . 3. For example, the soft thresholds S1L and S1H define a soft error zone around RV1. In some embodiments the memory controller classifies readout errors that fall in the soft error zones as soft errors. The memory controller can use any suitable method to determine the soft error zones. For example, the memory controller can use soft voltage zones that are used for evaluating the LLRs as soft error zones. The soft error zones can be set fixed, or may be updated adaptively.

The memory controller additionally determines hard error zones in which the readout errors are classified as hard errors. In an example embodiment, the voltage ranges outside the soft error zones serve as hard error zones. In the example of FIG. 2, the secondary peaks of L1 and L0 are positioned higher than RV2 and relate to memory cells that suffer programming errors in the LSB page. LSB readout errors that occur at voltages higher than S2H or lower than S2L are classified as LSB hard errors. AS another example, threshold voltages under the distribution L1 and below RV1 represent MSB page readout errors, of which those that fall below S1L are classified as MSB hard errors.

The reading and error classification configurations of FIG. 2 above are given by way of example and other suitable configurations can be used. For example, programming errors may create more than a single secondary peak in the threshold voltage distribution, and at various positions on the voltage axis. As another example, similar reading and error classification configurations apply to memory devices having a number of programming states other than four.

Quality Test that Selectively Emphasizes Readout Errors

In some embodiments, testing the memory quality is conducted by comparing between a quality metric and a quality threshold. The quality test can be conducted, for example, at production time or during normal operation of the memory device (typically on read user data). The memory controller (or a host with which the memory controller communicates) may initiate testing the memory quality at any suitable instance, such as, for example, periodically, or in response to any suitable trigger.

The quality metric and the quality threshold are based on the numbers of readout errors, which are classified into multiple types, wherein at least one of the quality metric and the quality threshold emphasizes the readout errors of selected types. Example embodiments in which the readout errors are classified into hard and soft errors are described below.

In the description that follows, NH and NS denote the number of hard and soft errors, respectively. In addition, QM denotes a quality metric and QT denotes a quality threshold. In the embodiments that are described below, the quality metric QM increases as a function of the numbers of soft and hard errors, and therefore higher QM values indicate lower quality levels. In alternative embodiments, a quality metric for which higher metric values indicate higher quality levels can also be used.

Figure 3:
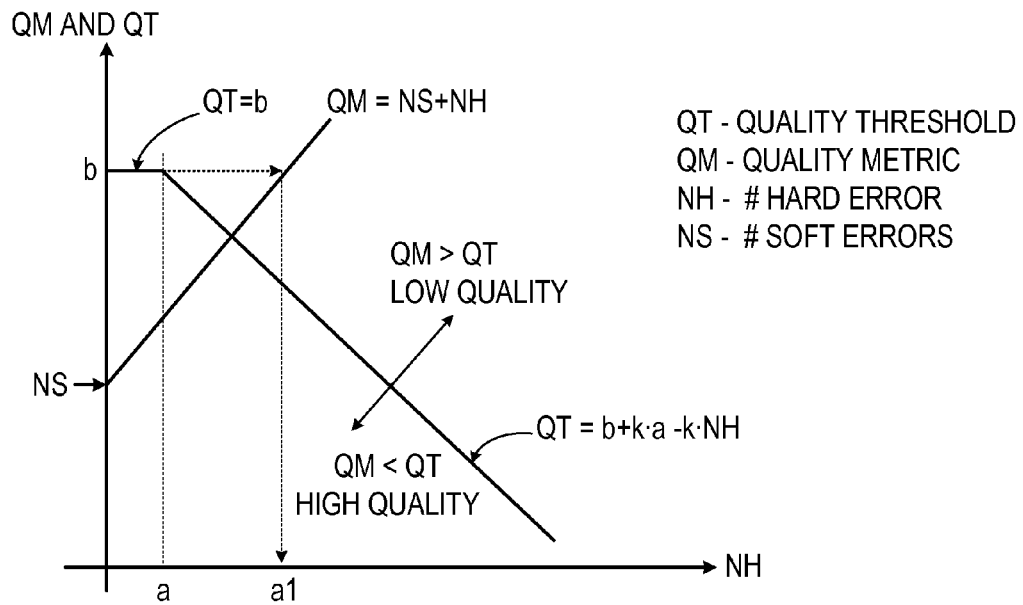
FIG. 3 is a diagram depicting graphs of a quality metric and of a quality threshold that emphasizes hard errors relative to soft errors, in accordance with an embodiment that is described herein.
Figure 4:
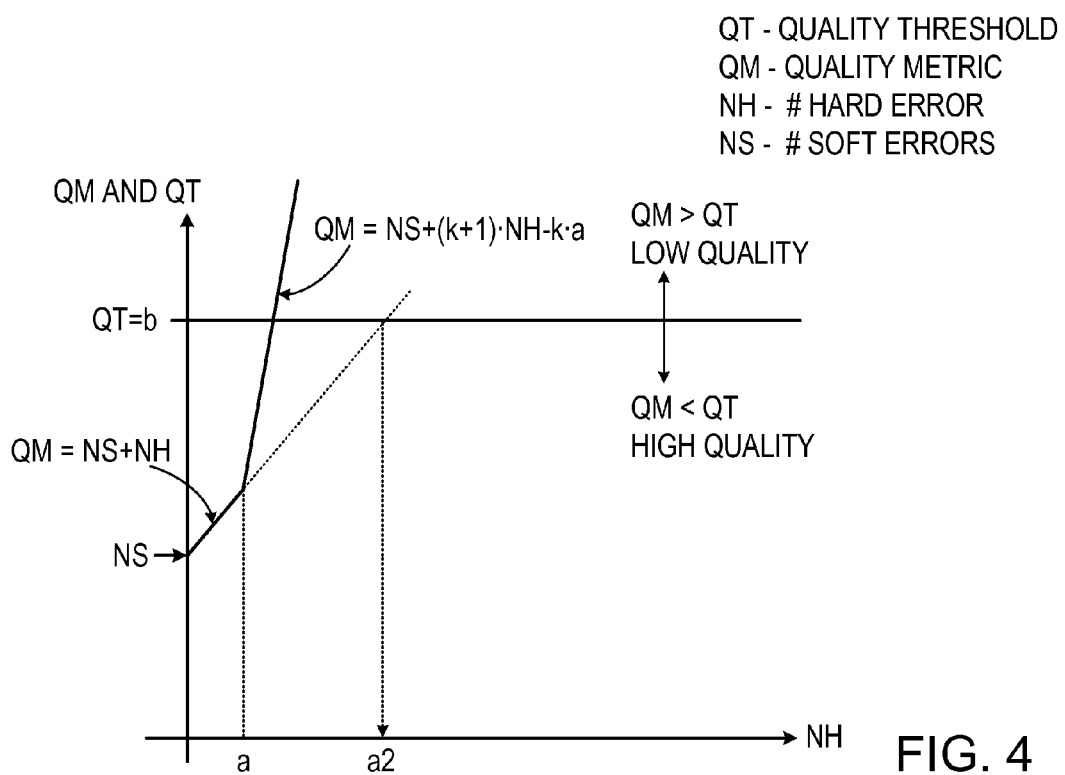
FIG. 4 is a diagram depicting graphs of a quality metric, which emphasizes hard errors relative to soft errors, and of a constant quality threshold, in accordance with an embodiment that is described herein.

In an embodiment, a memory quality test that compares between QM and QT is described in Equation 1. FIGS. 3 and 4 below provide example embodiments of specific quality metrics and quality thresholds.

IF QM>QT: memory quality is too low   Equation 1:

Otherwise: memory quality is sufficient

FIG. 3 is a diagram depicting graphs of a quality metric QM and of a quality threshold QT that emphasizes hard errors relative to soft errors, in accordance with an embodiment that is described herein. In FIG. 3 the quality metric equals the total number of readout errors, i.e., QM=NS+NH, which weights both error types equally. In contrast, the quality threshold QT gets a constant value b as long as the number of hard errors NH is kept below a given number 'a', and decreases linearly at higher numbers of hard errors. A function describing the graph of the quality threshold is given in Equation 2:

$$QT = \begin{cases} b & NH \le a \\ b + k \cdot a - k \cdot NH & NH > a \end{cases} \quad \text{Equation 2}$$

In an embodiment, the coefficients 'a' and 'b' in Equation 2 are positive integers. In addition, the slope 'k' in Equation 2 is set in the range k>0, so that the quality threshold decreases as NH increases, and therefore a quality test that uses Equations 1 and 2 above emphasizes the hard errors relative to the soft errors.

In FIG. 3, 'a1' represents the number of hard errors that would have been required to decide on insufficient quality, by using an alternative quality test in which the quality threshold is constant. As seen in the figure, 'a1' falls to the right of the intersection point between QM and QT, meaning that this alternative test is biased, i.e., a larger number of hard errors would have been required to decide that the memory quality has become too low.

FIG. 4 is a diagram depicting graphs of a quality metric QM, which emphasizes hard errors relative to soft errors, and of a constant quality threshold QT, in accordance with an embodiment that is described herein. In FIG. 4, the quality threshold is constant, i.e., QT=b. A function that describes the graph of the quality metric is given in Equation 3:

$$QM = \begin{cases} NS + NH & NH \le a \\ NS + (k+1) \cdot NH - k \cdot a & NH > a \end{cases} \quad \text{Equation 3}$$

In the present example QM comprises a piecewise linear function that comprises two segments. In the first segment, which refers to numbers of hard errors in the range $0 \le NH \le a$, the quality metric is given by QM=NS+NH. In the second segment, for which NH>a, the quality metric is given by QM=NS+(K+1)·NH−k·a. In Equation 3 the coefficients 'a' and 'b' are positive integers. In an embodiment, 'k' is selected in the range k>0 so that the slope in the second segment is steeper than in the first segment. As a result, an embodiment in which the quality test uses Equations 1 and 3 above, emphasizes the hard errors relative to the soft errors.

In FIG. 4, 'a2' represents the number of hard errors that would have been required to decide on insufficient quality, by using an alternative quality test that does not emphasize the hard errors. As seen in the figure, 'a2' falls to the right of the intersection point between QM and QT, meaning that in the alternative test a larger number of hard errors is required to decided that the quality has become too low.

The quality metric and quality threshold configurations given in FIGS. 3 and 4 above are given by way of example and other suitable configurations can also be used. For example, in some embodiments the coefficients 'a' and 'b', and the slope 'k' are predefined constants. In alternative embodiments, at least one of 'a', 'b' and 'k' is updated adaptively during the lifetime of the memory device, to reflect changes in the quality degradation behavior, e.g., due to aging.

As another example, although FIGS. 3 and 4 describe the quality metric and quality threshold as piecewise linear functions, in alternative embodiment, at least one of the quality metric and quality threshold comprises a nonlinear function that may be a fixed predefined function or a function that updates adaptively.

Figure 5:
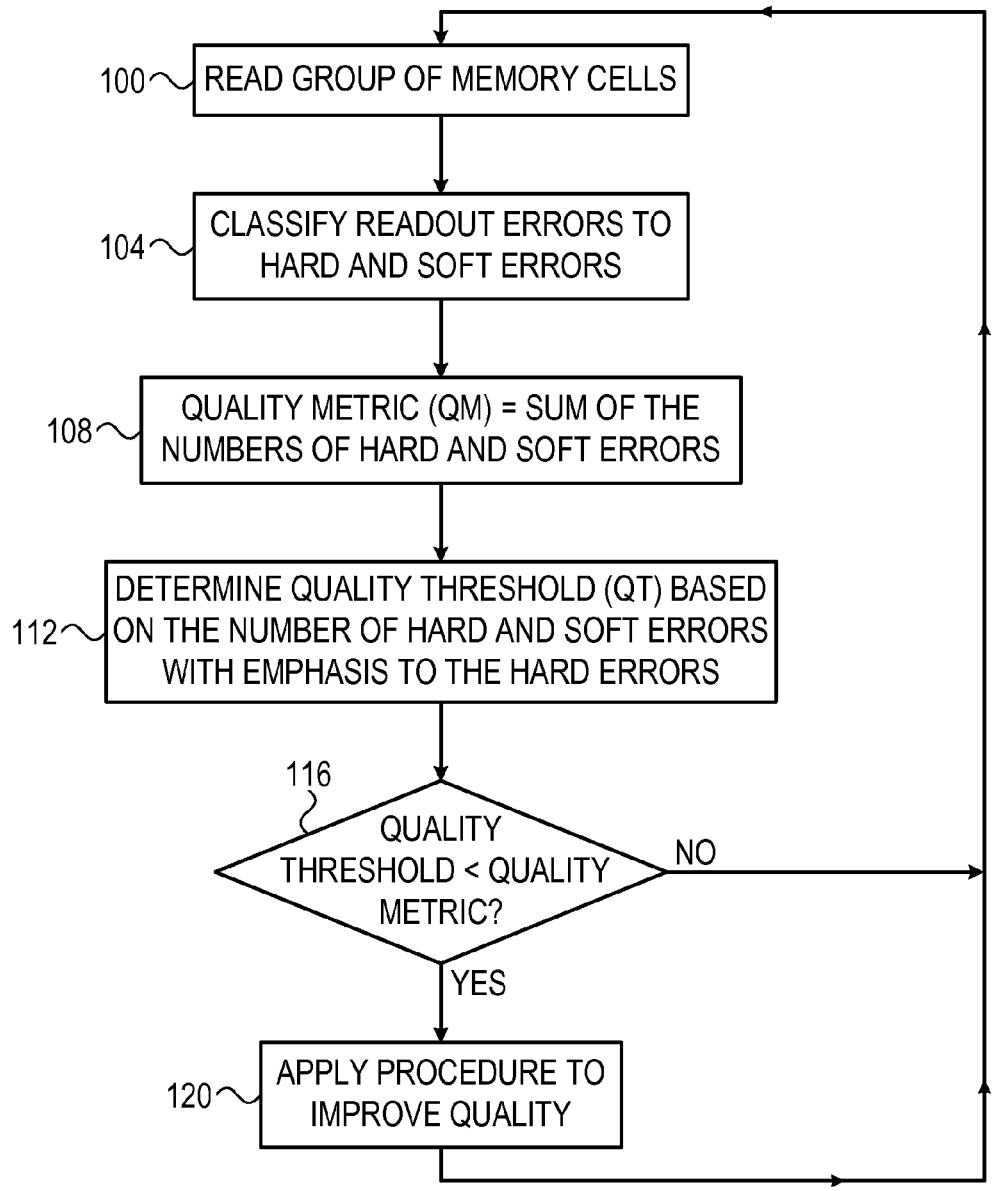
FIG. 5 is a flow chart that schematically illustrates a method for assessing memory quality, in accordance with an embodiment that is described herein.

FIG. 5 is a flow chart that schematically illustrates a method for testing the memory quality, in accordance with an embodiment that is described herein. The method can be executed, for example, by processor 48 of memory controller 40. Alternatively, the method can be executed by any other element or elements of the storage circuitry described above.

At a reading step 100, processor 48 reads a group of memory cells 32 of memory device 24. The group of memory cells may comprise one or more storage units, such as, for example, a page or a block. Alternatively, any other suitable group of memory cells can also be used.

At a classification step 104, the processor first identifies memory cells whose readouts are erroneous, and then classifies the readout errors into hard and soft error types. The processor classifies the readout errors by classifying the respective threshold voltages of the memory cells into soft and hard error zones, as described above. The processor can identify the readout errors using any suitable method. Several example methods for readout errors identification are described herein.

In one embodiment, at step 104, the processor identifies the readout errors by detecting respective differences between data to be decoded by ECC unit 50, and respective decoded data at the output of ECC decoder 50. In another embodiment the processor possesses the correct data beforehand, for example, the processor first programs known data to the group of memory cells, and compares the read data to the known data. In yet another embodiment, the memory device is part of a Redundant Array of Independent Disks (RAID) storage system that stores redundant information in multiple devices so that lost or damaged data can be recovered. In such an embodiment, the processor first recovers the data that was stored in the group of the memory cells using RAID techniques, and then compares the recovered data to the read data.

At a quality metric estimation step 108, the processor estimates the quality metric (QM) as the total number of readout errors, i.e., the sum of the numbers of the soft and hard errors, as described, for example, in FIG. 3 above. At a threshold determination step 112, the processor determines the quality threshold (QT), for example, using Equation 2 above.

The processor then compares between the estimated quality metric of step 108 and the determined threshold of step 112 above, at a decision step 116. If at step 116 QM>QT, the processor concludes that the memory quality is unacceptably low and proceeds to an application step 120 to apply a suitable procedure to improve the memory quality, such as, for example, a memory refresh procedure. Alternatively or additionally, the processor may generate a suitable alert, e.g., to be used by a host with which the processor communicates. If the condition at step 116 is not met or following step 120, the processor loops back to step 100 to read the same or another group of memory cells.

The quality test configuration in FIG. 5 is given by way of example, and other suitable quality test configurations can also be used. For example, steps 108 and 112 use the quality metric and quality thresholds that were described in FIG. 3 above. In alternative embodiments, any other suitable quality metric and quality threshold can be used, such as those described in FIG. 4 above.

Quality Estimation During Manufacturing

During manufacturing, memory devices are typically tested by first applying many storage operations and then checking whether data that is stored in the memory can be retrieved correctly. For example, during production all the memory devices are moderately tested, whereas during process qualification only a sample that typically includes a few hundreds of devices are tested extensively (the extensive tests cannot be applied to all of the manufactured devices.) Although checking for read errors can be done by applying ECC decoding, this approach is typically too complex to be employed during testing, and instead the testing procedure counts the erroneous read bits (assuming known programmed data) and compares the number of errors to the error correcting capability of the ECC to be used. Such a testing method, which is equivalent to ECC decoding, is suitable when using algebraic codes (e.g., a BCH code), which have a fixed and guaranteed error correction capability (e.g., 42 bit errors per 1 KByte of data).

In contrast to algebraic codes, modern ECCs such as, for example, LDPC, GLDPC, or Turbo codes (which are typically decoded iteratively) have no guaranteed correction capability to a given level. In some embodiments, a memory device is tested during production using a testing procedure, which is approximately equivalent to ECC decoding, by classifying the read errors to hard and soft errors and assigning a memory quality that emphasizes the hard errors relative to the soft errors, using for example the embodiments disclosed above.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for data storage, comprising:
in a memory device comprising multiple memory cells that store data in analog values, defining a given setting of one or more read thresholds;
dividing a range of the analog values into multiple zones depending on the read thresholds, and assigning reliability levels to hard bit decisions associated with the respective zones;
performing a hard read operation that reads the analog values from a group of the memory cells and produces hard bit decisions regarding positions of the read analog values relative to the read thresholds of the given setting of the read thresholds;
identifying erroneous hard decisions in the data that was read in the hard read operation using the given setting of the read thresholds, and performing a classification of the erroneous hard decisions into at least first and second different hard-error types, depending on the zones in which the analog values fall; and
determining for the group of the memory cells, based on evaluated numbers of the erroneous hard decisions of the first and second hard-error types, a memory quality metric that depends on the different reliability levels assigned to the erroneous hard decisions of the first and second hard-error types.

2. The method according to claim 1, wherein performing the classification comprises classifying the erroneous hard decisions that fall in a predefined vicinity of the read thresholds to the first hard-error type, and classifying the erroneous hard decisions that fall outside the predefined vicinity of the read thresholds to the second hard-error type.

3. The method according to claim 1, wherein determining the memory quality metric comprises comparing the memory quality metric to a quality threshold.

4. The method according to claim 3, wherein determining the memory quality metric comprises assigning to the erroneous hard decisions road of the second hard-error type a higher reliability level in setting the quality threshold relative to the reliability level assigned to the erroneous hard decisions of the first hard-error type.

5. The method according to claim 3, wherein determining the memory quality metric comprises assigning to the erroneous hard decisions of the second hard-error type a higher reliability level in setting the memory quality metric relative to the reliability level assigned to the erroneous hard decisions of the first hard-error type.

6. The method according to claim 3, wherein determining the memory quality metric comprises estimating the quality threshold as a non-increasing function of the evaluated number of erroneous hard decisions of the second hard-error type.

7. The method according to claim 6, wherein the non-increasing function comprises a piecewise linear function.

8. The method according to claim 3, wherein determining the memory quality metric comprises estimating the memory quality metric as a non-decreasing function of both the evaluated numbers of the erroneous hard decisions of the first and second hard-error types.

9. The method according to claim 8, wherein the non-decreasing function comprises a piecewise linear function.

10. The method according to claim 1, wherein determining the memory quality metric comprises modifying a reliability level assigned to the erroneous hard decisions of the second hard-error type during a lifetime of the memory device.

11. The method according to claim 1, wherein the data is stored redundantly in multiple memory devices using a Redundant Array of Independent Disks (RAID) storage scheme, and wherein reading the data comprises recovering in one memory device error-free data from erroneous data using redundant data stored in one or more other memory devices, and identifying the erroneous hard decisions by comparing the recovered data and the erroneous data.

12. The method according to claim 1, wherein performing the hard read operation and determining the memory quality are carried out during production or process qualification of the memory device.

13. An apparatus, comprising:
a memory device comprising memory cells that store data in analog values; and
storage circuitry configured to:
define a given setting of one or more read thresholds;
divide a range of the analog values into multiple zones depending on the read thresholds;
assign reliability levels to hard bit decisions associated with the respective zones;
perform a hard read operation that reads the analog values from a group of the memory cells and produces hard bit decisions regarding positions of the read analog values relative to the read thresholds of the given setting of the read thresholds;
identify erroneous hard decisions in the data that was read in the hard read operation using the given setting of the read thresholds, and perform a classification of the erroneous hard decisions into at least first and second different hard-error types, depending on the zones in which the analog values fall; and
determine for the group of the memory cells, based on evaluated numbers of the erroneous hard decisions of the first and second hard-error types, a memory quality metric that depends on the different reliability levels assigned to the erroneous hard decisions of the first and second hard-error types.

14. The apparatus according to claim 13, wherein the storage circuitry is configured to classify the erroneous hard decisions that fall in a predefined vicinity of the read thresholds to the first hard-error type, and to classify the erroneous hard decisions that fall outside the predefined vicinity of the read thresholds to the second hard-error type.

15. The apparatus according to claim 13, wherein the storage circuitry is configured to determine the memory quality metric by comparing the memory quality metric to a quality threshold.

16. The apparatus according to claim 15, wherein the storage circuitry is configured to assign to the erroneous hard decisions of the second hard-error type a higher reliability level in setting the quality threshold relative to the reliability level assigned to the erroneous hard decisions of the first hard-error type.

17. The apparatus according to claim 15, wherein the storage circuitry is configured to give the erroneous hard decisions of the second hard-error type a higher reliability level in setting the memory quality metric relative to the reliability level assigned to the erroneous hard decisions of the first hard-error type.

18. The apparatus according to claim 15, wherein the storage circuitry is configured to estimate the quality threshold as a non-increasing function of the evaluated number of erroneous hard decisions of the second hard-error type.

19. The apparatus according to claim 13, wherein the storage circuitry is configured to modify a reliability level assigned to the erroneous hard decisions of the second hard-error type during a lifetime of the memory device.

20. The apparatus according to claim 13, wherein the storage circuitry is configured to store the data redundantly in multiple memory devices using a Redundant Array of Independent Disks (RAID) storage scheme, to read the data by recovering in one memory device error-free data from erroneous data using redundant data stored in one or more other memory devices, and to identify the erroneous hard decisions by comparing the recovered data and the erroneous data.

\* \* \* \* \*